(12) United States Patent
Kenly et al.

(10) Patent No.: US 8,344,716 B2
(45) Date of Patent: Jan. 1, 2013

(54) METHODS AND SYSTEMS FOR POWER SUPPLY ADAPTIVE CONTROL UTILIZING TRANSFER FUNCTION MEASUREMENTS

(75) Inventors: Stewart Kenly, Epping, NH (US); Paul W. Latham, II, Lee, NH (US)

(73) Assignee: L&L Engineering, LLC, Lee, NH (US)

( * ) Notice: Subject to any disclaimer, the term of this patent is extended or adjusted under 35 U.S.C. 154(b) by 321 days.

(21) Appl. No.: 12/622,484

(22) Filed: Nov. 20, 2009

(65) Prior Publication Data

US 2010/0127681 A1    May 27, 2010

Related U.S. Application Data

(60) Provisional application No. 61/116,897, filed on Nov. 21, 2008.

(51) Int. Cl.
   *G05F 1/00*    (2006.01)
(52) U.S. Cl. .......................... 323/283; 323/285
(58) Field of Classification Search .................. 323/241, 323/265, 271, 282, 283, 285
   See application file for complete search history.

(56) References Cited

U.S. PATENT DOCUMENTS

| | | | |
|---|---|---|---|
| 4,067,060 A | 1/1978 | Poussart et al. | |
| 4,975,823 A | 12/1990 | Rilly et al. | |
| 5,109,169 A * | 4/1992 | Hughes | 327/337 |
| 5,668,464 A | 9/1997 | Krein et al. | |
| 6,249,447 B1 | 6/2001 | Boylan et al. | |
| 6,618,711 B1 * | 9/2003 | Ananth | 706/14 |
| 6,833,691 B2 * | 12/2004 | Chapuis | 323/283 |
| 6,979,987 B2 | 12/2005 | Kernahan et al. | |
| 7,521,907 B2 * | 4/2009 | Cervera et al. | 323/268 |
| 7,528,590 B2 | 5/2009 | Wei | |
| 7,545,130 B2 | 6/2009 | Latham | |
| 7,548,047 B1 | 6/2009 | Dasgupta et al. | |
| 7,548,048 B2 | 6/2009 | Chang | |
| 7,558,084 B2 | 7/2009 | Jang | |
| 7,592,789 B2 | 9/2009 | Jain | |
| 7,595,613 B2 | 9/2009 | Thompson et al. | |
| 7,595,686 B2 * | 9/2009 | Maksimovic et al. | 327/540 |
| 2003/0040817 A1 | 2/2003 | Krah et al. | |
| 2005/0187752 A1 * | 8/2005 | Colby et al. | 703/19 |
| 2007/0073523 A1 * | 3/2007 | Pfundlin et al. | 702/189 |
| 2007/0108953 A1 * | 5/2007 | Latham | 323/283 |
| 2007/0236200 A1 | 10/2007 | Canfield et al. | |
| 2009/0212751 A1 | 8/2009 | Cervera et al. | |

OTHER PUBLICATIONS

Corradini, L. et al., Simplified Model Reference-Based Autotuning for Digitally Controlled SMPS, IEEE Transactions on Power Electronics, vol. 23, Issue 4, Date: Jul. 2008, pp. 1956-1963.

Shirazi, M. et al., Autotuning Techniques for Digitally-Controlled Point-of-Load Converters with Wide Range of Capacitive Loads, Twenty Second Annual IEEE Applied Power Electronics Conference, APEC 2007—Date: Feb. 25, 2007-Mar. 1, 2007, pp. 14-20.

(Continued)

*Primary Examiner* — Gary L Laxton
*Assistant Examiner* — Gary Nash

(57) ABSTRACT

Methods and systems, utilizing simplified digital hardware, for measuring parameters needed for control of a system (referred to as a plant) such as a power supply or motor. In one embodiment, the system for measuring the desired parameters includes simplified digital hardware to implement the functionality of transfer function measurement in the plant.

19 Claims, 8 Drawing Sheets

OTHER PUBLICATIONS

Zhao, Z. et al., ESR Zero Estimation and Auto-compensation in Digitally Controlled Buck Converters, Twenty-Fourth Annual IEEE Applied Power Electronics Conference and Exposition, 2009. APEC 2009. Date: Feb. 15-19, 2009, pp. 247-251.

Buiatti, G.M. et al., An Online Technique for Estimating the Parameters of Passive Components in Non-Isolated DC/DC Converters, IEEE International Symposium on Industrial Electronics, 2007, ISIE 2007, Date: Jun. 4-7, 2007, pp. 606-610.

Buiatti, G.M. et al., ESR Estimation Method for DC/DC Converters Through Simplified Regression Models, 42nd IAS Annual Meeting. Conference Record of the Industry Applications Conference, 2007, Date: Sep. 23-27, 2007, pp. 2289-2294.

Buiatti, G.M. et al., Parameter Estimation of a DC/DC Buck converter using a continuous time model, 2007 European Conference on Power Electronics and Applications, Date: Sep. 2-5, 2007, pp. 1-8.

Shirazi, M. et al. Integration of Frequency Response Measurement Capabilities in Digital Controllers for DC-DC Converters, IEEE Transactions on Power Electronics 23(5), Sep. 2008, 2524-2535.

Morroni, J. et al. Design and Implementation of an Adaptive Tuning System Based on Desired Phase Margin for Digitally Controlled DC-DC Converters, IEEE Transactions on Power Electronics 24(2), Feb. 2009, 559-564.

International Search Report and Written Opinion dated Jan. 21, 2010 for PCT/US09/65264.

* cited by examiner

Measurement Technique

Table Based Digital Oscillator
23A

METHODS AND SYSTEMS FOR POWER SUPPLY ADAPTIVE CONTROL UTILIZING TRANSFER FUNCTION MEASUREMENTS

CROSS REFERENCE TO RELATED APPLICATIONS

The present application claims priority to U.S. Provisional Application No. 61/116,897 filed Nov. 21, 2008 entitled METHODS AND SYSTEMS FOR POWER SUPPLY ADAPTIVE CONTROL UTILIZING TRANSFER FUNCTION MEASUREMENTS which is incorporated herein in its entirety by reference.

BACKGROUND

These teachings relate generally to adaptive control, and in particular, to the measurement of desired system parameters needed for feedback or adaptive control.

Feedback control systems in general and for power supplies in particular, have performance and stability limitations caused by unknown component variations. To achieve high speed transient performance it is necessary to have an accurate measurement of several key parameters. In particular, in the case of power supplies, the output capacitance may be largely unknown. This is due to the fact, that the power supply load has capacitance and it is in parallel to power supply output capacitance. Commonly, the load capacitance is in the form of additional capacitance added in the load circuit to improve high frequency characteristics and is, thus, required.

Unfortunately, the unknown load capacitance and possibly other components with significant tolerances are common occurrences in power supplies. A similar situation can occur in motor control where the motor torque constant and the load inertia are generally not known precisely enough for high speed control.

To allow for compensation for these unknown parameters it is necessary to measure them. Once these parameters are measured, calculations or gains scheduling can be used to map the measured parameters to required controller gains. Thus, there is a need for simplified digital hardware that can be used to measure the desired parameters.

SUMMARY

In one embodiment, the system of these teachings includes a stimulus source and signal measurement means. In one instance, the signal measurement means can include one or more correlators. In one embodiment, the stimulus source can include a source of basis functions. In one instance, the basis functions can be sinusoidal functions. Other instances of basis functions, such as, for example, but not limited to, square waves or Walsh functions, are also within the scope of these teachings.

In another embodiment, the system of these teachings can also include a compensator component, one or more processors and computer usable media. In one instance, the computer usable media can include computer readable code embodied therein and the computer readable code can cause the one or more processors to process the results of the signal measurement means and adjust parameters of the compensator based on the processed results.

Other embodiments of the system of these teachings and the methods of these teachings are also disclosed. In one embodiment, the system of these teachings can include simplified digital hardware to implement the functionality of transfer function measurement in a power supply. Conventional components to implement the functionality of transfer function measurement are typically very expensive (typically in the range of US $10,000-30,000) and bulky. These teachings can enable transfer function measurement functionality to be included in the power supply at a modest cost (in one instance less than one cent when implemented in deep sub micron CMOS). In one embodiment, the method of these teachings for measuring these unknown parameters is based on utilizing simplified hardware of these teachings to measure steady state transfer function characteristics. These transfer function characteristics can then be related by conventional techniques to the unknown parameters of system.

In one embodiment, a switching power supply of the present teachings can include, but is not limited to including, a circuit including at least two reactive components. The circuit can provide an output voltage and can be switched from one output voltage state to another output voltage state. The system can further include a switching component. The switching component can be operatively connected to switch the circuit between switching states. The switching states can include both output voltage states. The system can still further include a driver component operatively connected to drive the switching component in order to cause switching between two of the switching states, and a compensator component operatively connected to receive an input control signal and parameters, and to provide the switching states to the driver component. The system can further include a signal generator providing sinusoidal basis signals having in phase and quadrature components as input to the switching power supply, and a correlator. The correlator can receive basis signals from the signal generator, and can receive a power supply signal from the switching power supply. The correlator can provide a correlation between the a power supply signal and one of the in-phase and quadrature components. The system can also include a processor and a computer readable medium. The computer readable medium can have a first computer readable code embodied therein causing the processor to obtain a transfer function based on the correlation, compute the parameters from the transfer function, and provide the parameters to the compensator. The power supply signal can optionally include an output power supply signal or an output power supply signal and an input power supply signal. The signal generator can optionally include an oscillator. The oscillator can include, but is not limited to including, a table of values providing the in-phase components and quadrature components and a counter that is updated when the table is accessed. The oscillator can access the values according to the updated counter. The oscillator can generate the in-phase components and quadrature components based on forward and backward Euler integrators. The correlator can include an accumulator that accumulates a product of two inputs. The computer readable code can cause the processor to store the transfer function in the computer readable medium, and can recall the transfer function based on preselected conditions.

In one embodiment, a controller for a system of the present teachings can include, but is not limited to including, a signal generator providing sinusoidal basis signals having in phase and quadrature components as input to the system, and a correlator. The correlator can receive the basis signals from the signal generator and can receive a system signal from the system. The correlator can provide a correlation between a system signal and one of the in-phase and quadrature components. The controller can further include a processor and a computer readable medium having a first computer readable code embodied therein causing the processor to obtain a transfer function based on the correlation, to compute parameters from the transfer function, and to provide the parameters to the system. The signal generator can include, but is not limited to including, an oscillator. The oscillator can include, but is not limited to including, a table of values providing the in-phase components and quadrature components, and a counter that is updated when the table is accessed. The oscillator can access the values according to the updated counter. The oscillator can optionally generate in-phase components and quadrature components based on forward and backward Euler integrators. The computer readable code can cause the processor to store the transfer function in the computer readable medium and recall the transfer function based on pre-selected conditions. The correlator can include, but is not limited to including, an accumulator that accumulates a product of two inputs.

In one embodiment, a method for obtaining parameters for adaptive control of a system can include, but is not limited to including, the step of providing, in a power supply, a multiplier component, an adder component, and a delay component to obtain a correlation between the system signal and one of in-phase and quadrature components of sinusoidal basis signals. The method can further include the steps of obtaining transfer function characteristics based on the correlation, and obtaining the parameters based on the transfer function characteristics. The system signal can optionally include an output system signal or an output system signal and an input system signal. The method can optionally include the step of generating the basis signals by an oscillator. The step of generating the basis signals can include, but is not limited to including, the steps of associating the in-phase and quadrature components of the basis signal with a table of values, updating a counter when the table is accessed, and accessing the values according to the updated counter. The method can further optionally include the step of generating the in-phase and quadrature components based on forward and backward Euler integrators, storing the transfer function characteristics in a computer readable medium, and recalling the transfer function characteristics based on pre-selected conditions.

For a better understanding of the present teachings, together with other and further needs thereof, reference is made to the accompanying drawings and detailed description.

DETAILED DESCRIPTION

An exemplary embodiment is described below in order to better illustrate the system of these teachings. The exemplary embodiment uses a buck converter topology. However the methods of these teachings are applicable to any generic converter of buck, boost, or buck-boost, forward, fly-back, SEPIC, cuk, or other type. With some of these other types of converters, many switch states are possible. For example, in the buck-boost topology, the switch states are buck, boost, buck-boost, short across the inductor, and open. With the buck topology, the switch states are charging, discharging, and tri-state. The method and systems of these teachings are also applicable to other systems such as, but not limited to, motor control systems.

In one embodiment, the measurement is performed by injecting a signal into the power supply in a manner that stimulates the unknown power supply components. The input and output of the power supply network is then measured. In one instance, the inputs and outputs of the power supply network under question are measured by using correlation. Mathematically this is the projection of the signal on to a known function. These known functions are termed basis functions. By knowing the coefficient multiplying (also referred to as the size of) each of these basis functions in the original signal, the original signal can be reconstructed by using the measured projections as scale factors. If the known functions are harmonically related sinusoids, the result is a Fourier series. It should be noted that other series expansions in terms of other basis functions are also within the scope of these teachings. It should also be noted that one skilled in the art will recognize the relationship between a series expansion in the discrete representation and an integral representation in the continuous case.

In one embodiment of these teachings, a single pair of orthogonal signals is used for correlation of the input and output. The projections are the gains of the basis components at the basis functions frequency. This technique provides the averaging needed to reduce or effectively eliminate noise and load current sensitivity. To simplify the analysis of the measurements, it is possible to use a sinusoidal stimulation. (Sinusoids are eigenfunctions of linear systems and the input and outputs are then of the same form). Other inputs can be used, for example a square wave or Walsh functions. These can simplify the hardware at the expense of increased algorithmic complexity.

Figure 1A:
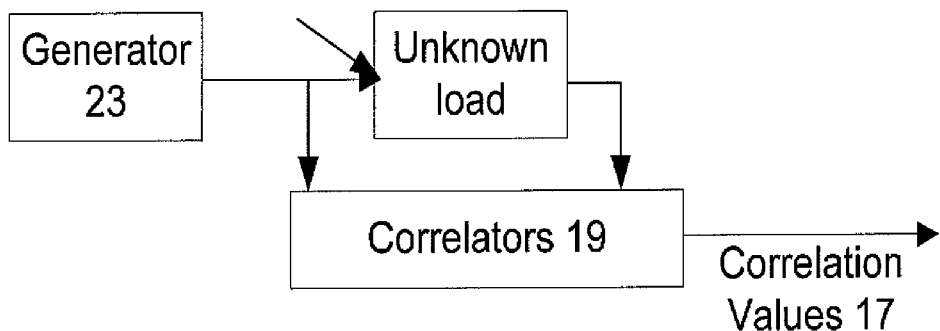
FIG. 1a is a schematic block diagram of a system of these teachings including a hardware digital generator for generating a stimulus signal.

Referring now to FIG. 1a, in one embodiment, the system of these teachings can include, but is not limited to including, hardware digital generator 23 (also referred to as oscillator 23) that can generate a sinusoidal stimulus 45 to the external power supply network. Correlators 19 can perform cross correlation between power supply network input and output terminals and sinusoid stimulus 45 and its quadrature. Correlations 17, the output of correlators 19, represent the complex signals of the input and output signals. The transfer function can be calculated as the ratio of the output signal to the input signal.

Figure 1B:
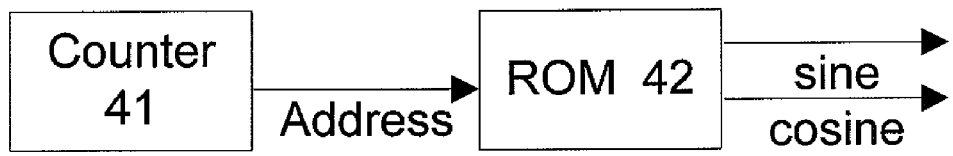
FIG. 1b is a schematic block diagram of a system of these teachings including a table look-up oscillator to generate a sinusoidal basis function.

Referring now to FIG. 1b, to generate the required sinusoidal and quadrature inputs, oscillator 23A can be used. Oscillator 23A can include, but is not limited to including, table 42 of values providing said in-phase components and quadrature components, and counter 41 that is updated when table 42 is accessed. Oscillator 23A can access the values according to the updated counter. Oscillator 23A, can be implemented in a variety of ways, table 42 with sinusoidal values accessed cyclically by counter 41 being one of the ways.

Figure 2:
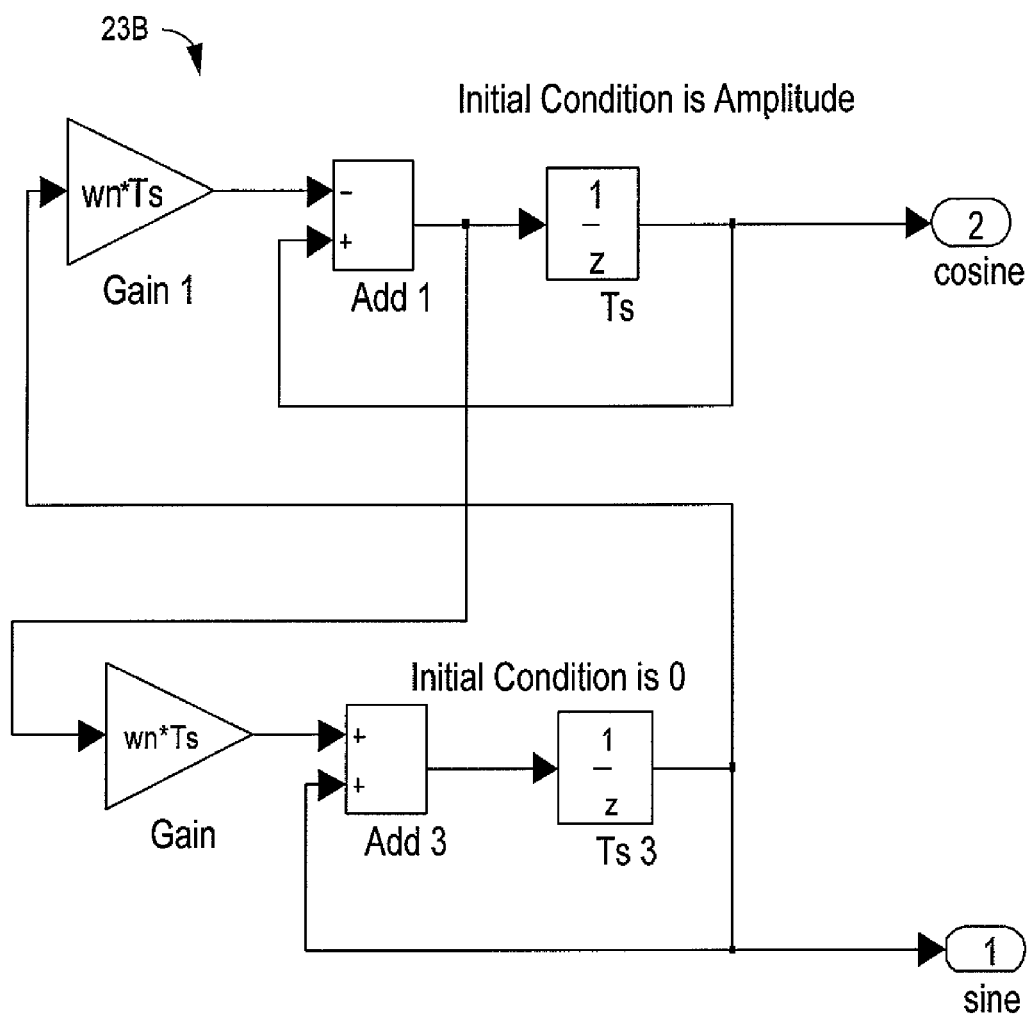
FIG. 2 is a schematic block diagram of a system of these teachings including an oscillator generating a sinusoidal signal and its quadrature using forward and backward Euler integrators.

Referring now to FIG. 2, a second method of generating a sinusoidal signal and its quadrature includes providing oscillator 23B that generates in-phase components and quadrature components based on forward and backward Euler integrators. The phases of the forward and backward integrators cancel, and this network rings at its resonant frequency with minimal damping. The initial condition of the cosine integrator determines the peak amplitude. The frequency of oscillation is determined by the gains. The gain value should be the resonant frequency in rads/sec multiplied by the sampling period.

Figure 3:
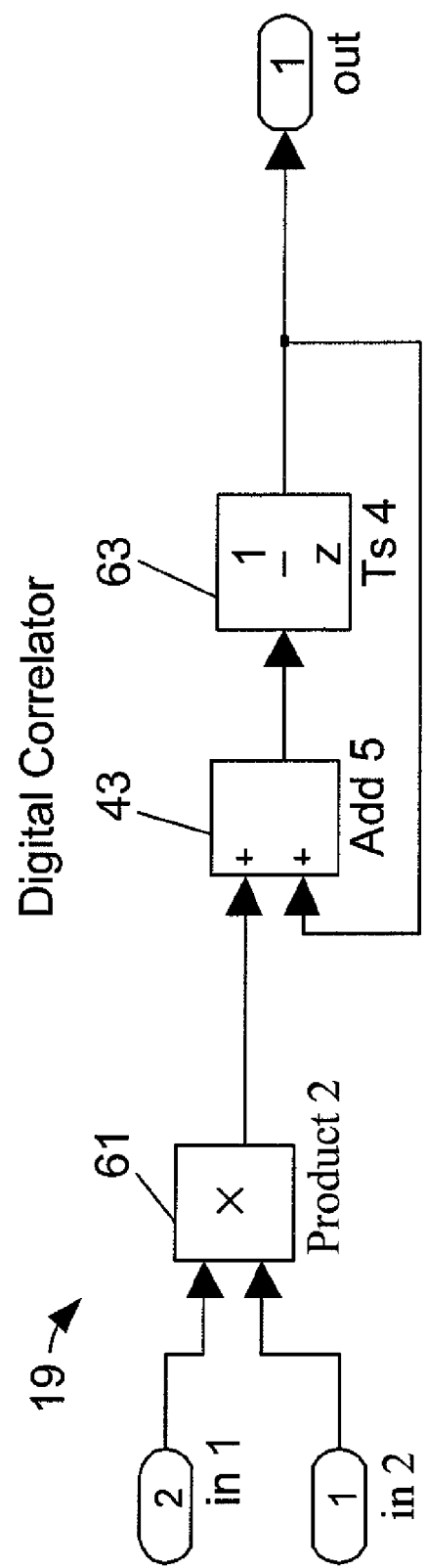
FIG. 3 is a schematic block diagram of a digital correlator of the present teachings including an accumulator.

Referring now to FIG. 3, digital correlator 19 can be, in one instance, accumulator 43 that accumulates the product of its two inputs.

Figure 4A:
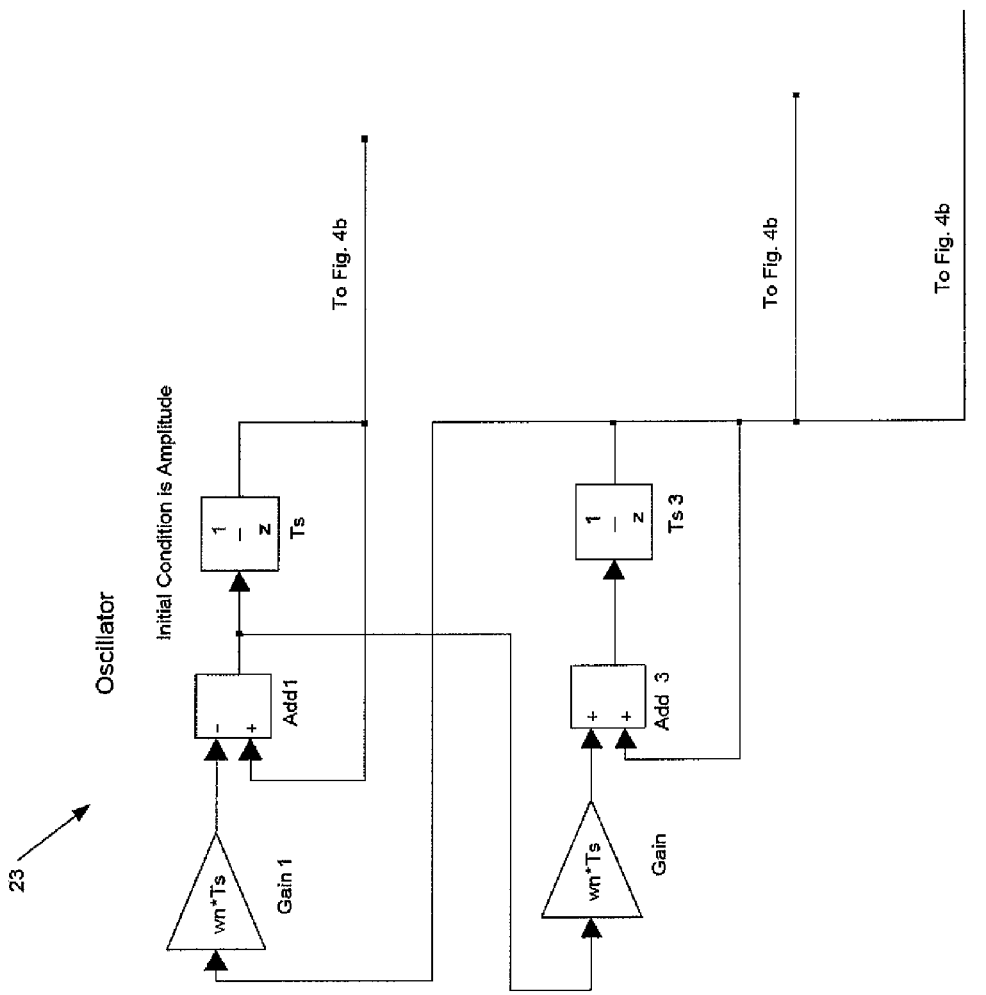
FIGS. 4a and 4b are schematic block diagrams of the system of these teachings in which four digital correlators are shown.
Figure 4B:
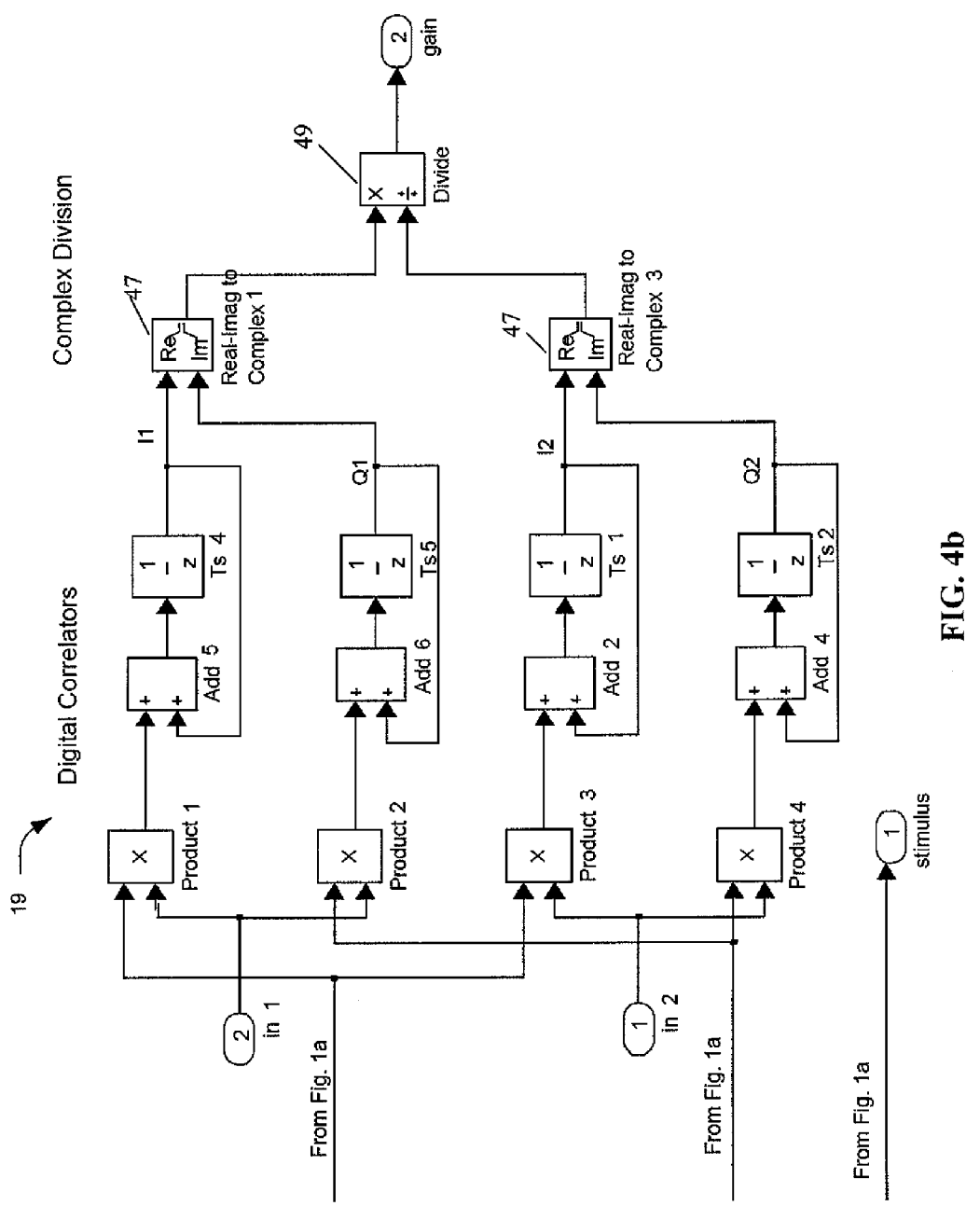

Referring now to FIGS. 4a and 4b, four digital correlators 19 (FIG. 4b) can be used. One pair of correlators can be used to measure the input and another pair can be used to measure the output signal projections onto the two sinusoidal basis functions. Oscillator 23 (FIG. 4a) and four digital correlators 19 (FIG. 4b) can be, but aren't limited to being, implemented in hardware. The resulting four values 47 are then processed by complex division 49. The division algorithm may either be implemented in hardware or in software. Typically, the system processor that is responsible for mapping the measured parameters and the compensator gains also performs the division function. The system can include a stimulus source, oscillator 23 (FIG. 4a), and signal measurement means, the four correlators 19 (FIG. 4b). Other embodiments, such as the embodiment shown in FIG. 1a, can include at least one correlator.

Figure 4C:
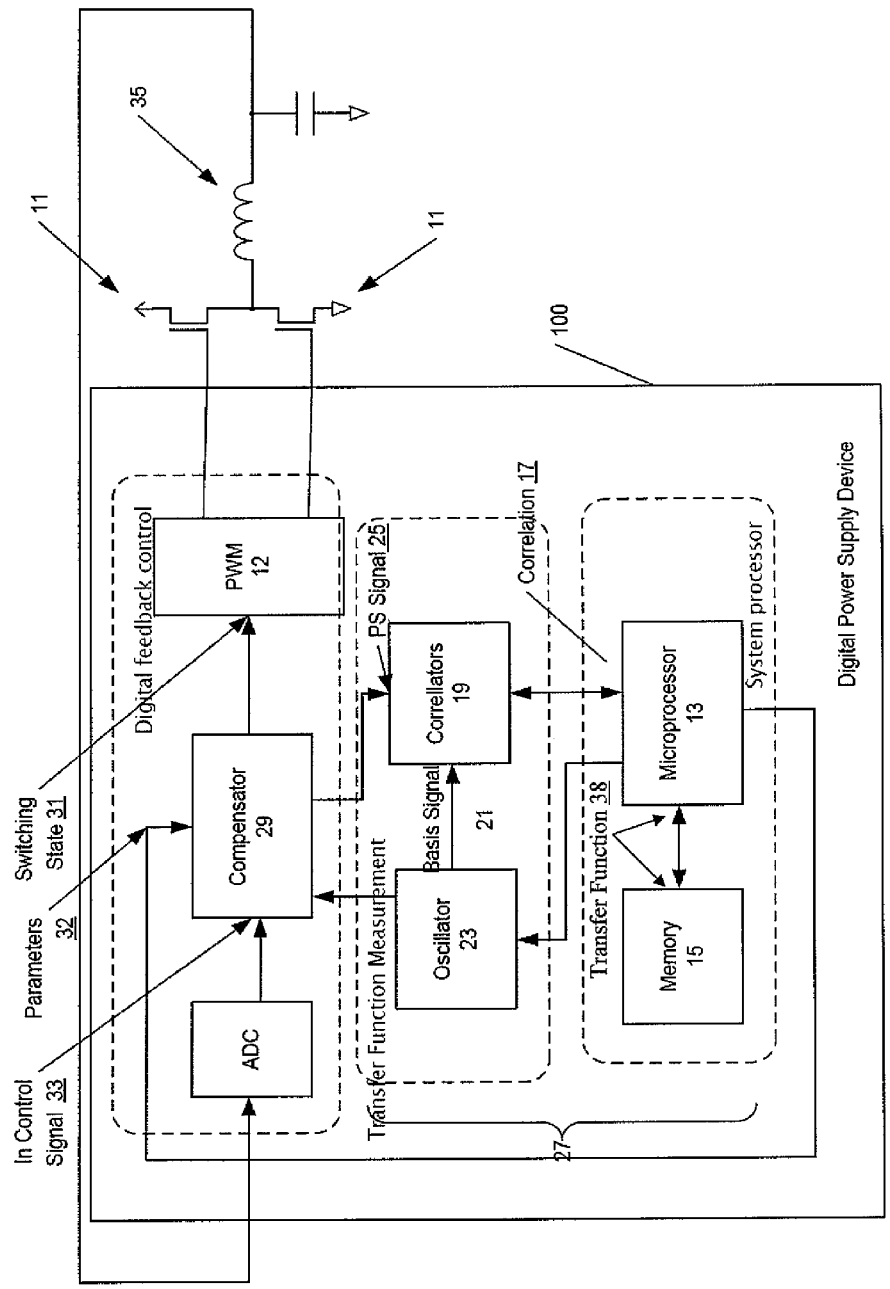
FIG. 4c is a schematic block diagram of a system of these teachings in which a possible partitioning between hardware and software is shown.

Referring now primarily to FIG. 4c, the switching power supply of the present teachings can include, but is not limited to including a circuit including at least two reactive components. The circuit can provide an output voltage and can be switched from one output voltage state 11 to another output voltage state 11. The switching power supply can further include at least one switching component. The switching component can be operatively connected to switch the circuit between at least two switching states 31. Switching states 31 can include output voltage states 11. The switching power supply can still further include driver component 12 operatively connected to drive the switching component in order to cause switching between switching states 31, and compensator component 29 that can be operatively connected to receive input control signal 33 and parameters 32, and can provide switching states 31 to driver component 12. The switching power supply can even still further include signal generator 23 that can provide sinusoidal basis signals 21 having in phase and quadrature components as input to the switching power supply, and at least one correlator 19 that can receive basis signals 21 from signal generator 23. Correlator 19 can receive power supply signal 25 from the switching power supply, and can provide at least one correlation 17 between power supply signal 25 and one of the in-phase and quadrature components. The switching power supply can still further include processor 13, and computer readable medium 15 having computer readable code embodied therein causing processor 13 to obtain transfer function 38 based on correlation 17, compute parameters 32 from transfer function 38, and provide parameters 32 to compensator component 29. Power supply signal 25 can optionally include an output power supply signal or an output power supply signal and an input power supply signal. The computer readable code can optionally cause processor 13 to store transfer function 38 in computer readable medium 15, and recall transfer function 38 from computer readable medium 15 based on pre-selected conditions.

Continuing to refer to FIG. 4c, a controller for a system can include, but is not limited to including, signal generator 23 that provides sinusoidal basis signals 21 having in phase and quadrature components as input to the system, and correlator 19 that can receive basis signals 21 from signal generator 23. Correlator 19 can receive system signal 25 from the system, and can provide correlation 17 between system signal 25 and one of the in-phase and quadrature components. The controller can also include processor 13, and computer readable medium 15 that includes computer readable code that causes processor 13 to obtain transfer function 38 based on correlation 17, compute parameters 32 from transfer function 38, and provide parameters 32 to the system. Signal generator 23 can optionally include oscillator 23A (FIG. 1b) that can include table 42 (FIG. 1b) of values providing the in-phase components and quadrature components, and counter 41 (FIG. 1b) that can be updated when table 42 (FIG. 1b) is accessed. Oscillator 23A (FIG. 1b) can access the values according to the updated counter. Signal generator 23 can also optionally include oscillator 23B (FIG. 2) that generates in-phase components and quadrature components based on forward and backward Euler integrators. The computer readable code can optionally cause processor 13 to store transfer function 38 in computer readable medium 15, and recall transfer function 38 from computer readable medium 15 based on pre-selected conditions. Correlator 19 can optionally include accumulator 43 (FIG. 3) accumulating a product of two inputs.

Continuing to still further refer to FIG. 4c, a possible partitioning between hardware and software is shown. Oscillator 23 and correlators 19 can be implemented in hardware and the complex division can be implemented in system microprocessor 13. System microprocessor 13 can then use resulting parameters 32 to adjust compensator 29. These adjustments can be made by using traditional closed loop analysis techniques that are implemented in the microprocessor 13. Alternatively, the result of these analysis techniques for different measurements can be stored in memory 15 and recalled based on capacitance or other measurements. System 100 can include stimulus source basis signal 21 and signal measurement means correlators 19. System 100 can also include processor 13 (shown here and referred to as a microprocessor) and computer usable medium (for example, memory 15) having computer readable code that causes processor 13 to process the results (for example, correlation 17) from the signal measurement means (correlators 19) in order to obtain parameters 32, and to provide those parameters 32 to compensator 29 in order to adjust compensator 29. In another embodiment, the processed results can be stored in computer usable medium (for example, memory 15) and the computer readable code causes processor 13 to recall the processed results based on predetermined conditions.

Continuing to even still further refer to FIG. 4c, the result of each correlator 19, correlation 17, is:

$$\text{corr} = \sum_{i=0}^{NM} \text{basis}(i)\text{signal}(i)$$

When the basis functions are orthogonal sinusoids and the measured signal is sinusoidal, the signal is $$\text{signal}(wnTsi/N) = A\sin(wnTsi/N) + B\cos(wnTsi/N)$$

Each pair of correlators 19, for sinusoidal signals, is:

$$\begin{bmatrix} \frac{NM}{2} & 0 \\ 0 & \frac{NM}{2} \end{bmatrix} \begin{bmatrix} A \\ B \end{bmatrix} = \begin{bmatrix} \sum_{i=0}^{NM} \sin(wnTsi/N)\text{signal}(wnTsi/N) \\ \sum_{i=0}^{NM} \sin(wnTsi/N)\text{signal}(wnTsi/N) \end{bmatrix}$$

Thus, the in phase and quadrature correlators are proportional to the complex signal amplitude. Note, the summing interval is chosen to be M cycles of the stimulus signal so the signals are orthogonal and the diagonal terms are zero. Since ratios are of interest (transfer function, impedance, etc.), the proportionality constant cancels.

Continuing to still further refer to FIG. 4c, a method for obtaining parameters 32 for adaptive control of a system can include, but is not limited to including, the step of providing, in a power supply, at least one multiplier component 61 (FIG. 3), at least one adder component 43 (FIG. 3), and at least one delay component 63 (FIG. 3) to obtain at least one correlation 19 of at least one system signal 25 with one of in-phase and quadrature components of sinusoidal basis signals 21. The method can also include the steps of obtaining transfer function characteristics based on correlation 19, and obtaining parameters 32 based on the transfer function characteristics. System signal 25 can optionally include an output system signal or an output system signal and an input system signal. The method can optionally include the step of generating basis signals 21 by oscillator 23. The step of generating basis signals 21 can include, but is not limited to including, the steps of associating the in-phase and quadrature components of basis signals 21 with table 42 (FIG. 1b) of values, updating counter 41 (FIG. 1b) when table 42 (FIG. 1b) is accessed, and accessing the values according to the updated counter. The step of generating basis signals 21 can include, but is not limited to including, the step of generating the in-phase and quadrature components based on forward and backward Euler integrators. The method can optionally include the steps of storing the transfer function characteristics in computer readable medium 15, and recalling the transfer function characteristics from computer readable medium 15 based on pre-selected conditions.

Figure 5:
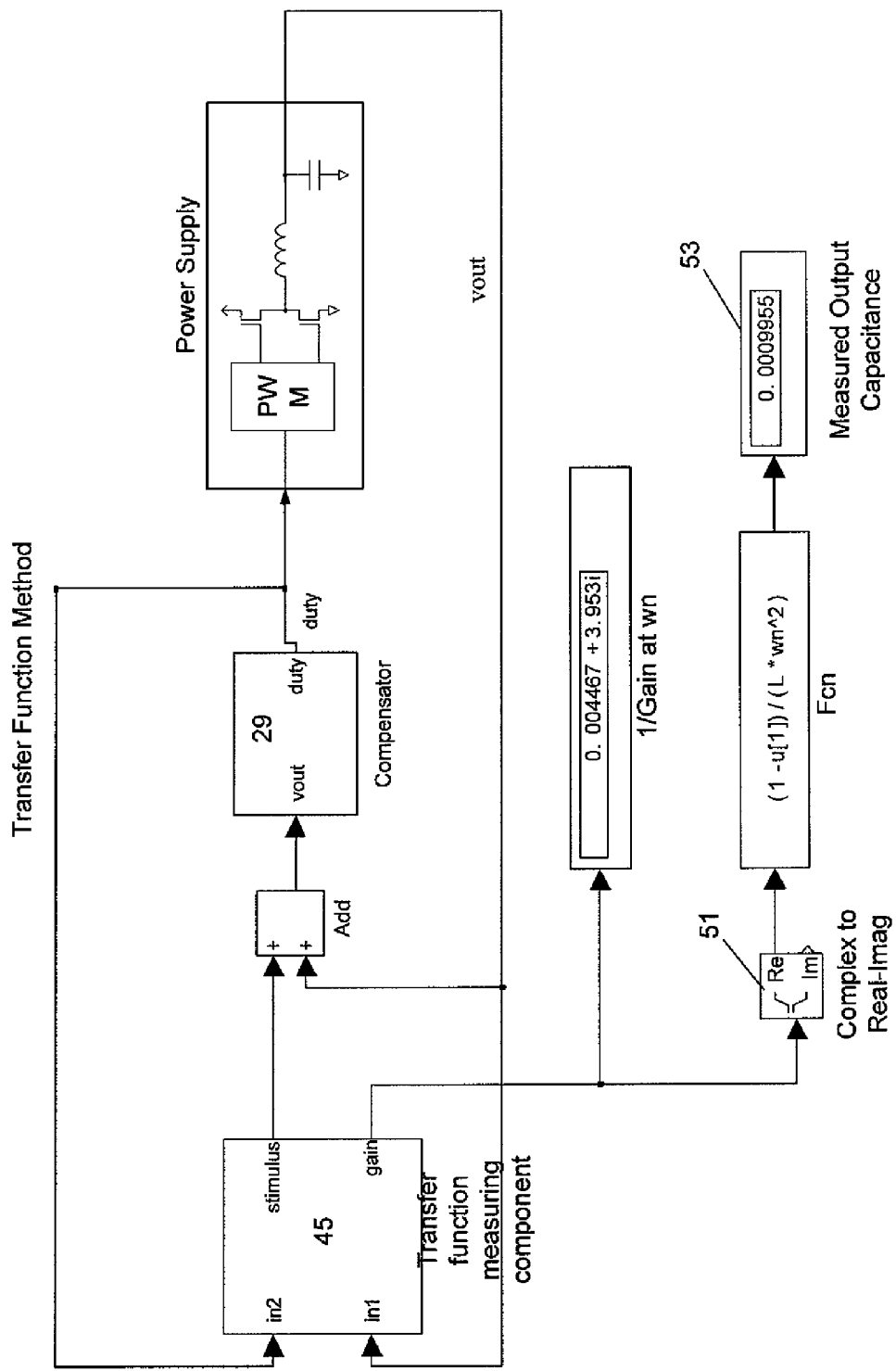
FIG. 5 is a schematic block diagram of the method for capacitance extraction of these teachings.

Referring now to FIG. 5, an embodiment of the method for capacitance extraction is shown. In this method the transfer function reciprocal is measured and real part 51 is used to calculate load capacitance 53 assuming a known inductance. Capacitance 53 is given by:

$$C = \frac{1 - \text{real}(duty/vout)}{Lwn^2} = \frac{1 - \text{real}((I_1 + iQ_1)/(I_2 + iQ_2))}{Lwn^2}$$

It can be seen in FIG. 5 that stimulus 45 is injected into the feedback loop reference. It is also possible to inject stimulus 45 after compensator 29. Depending on the frequency and closed loop bandwidth either method may be used.

Figure 6:
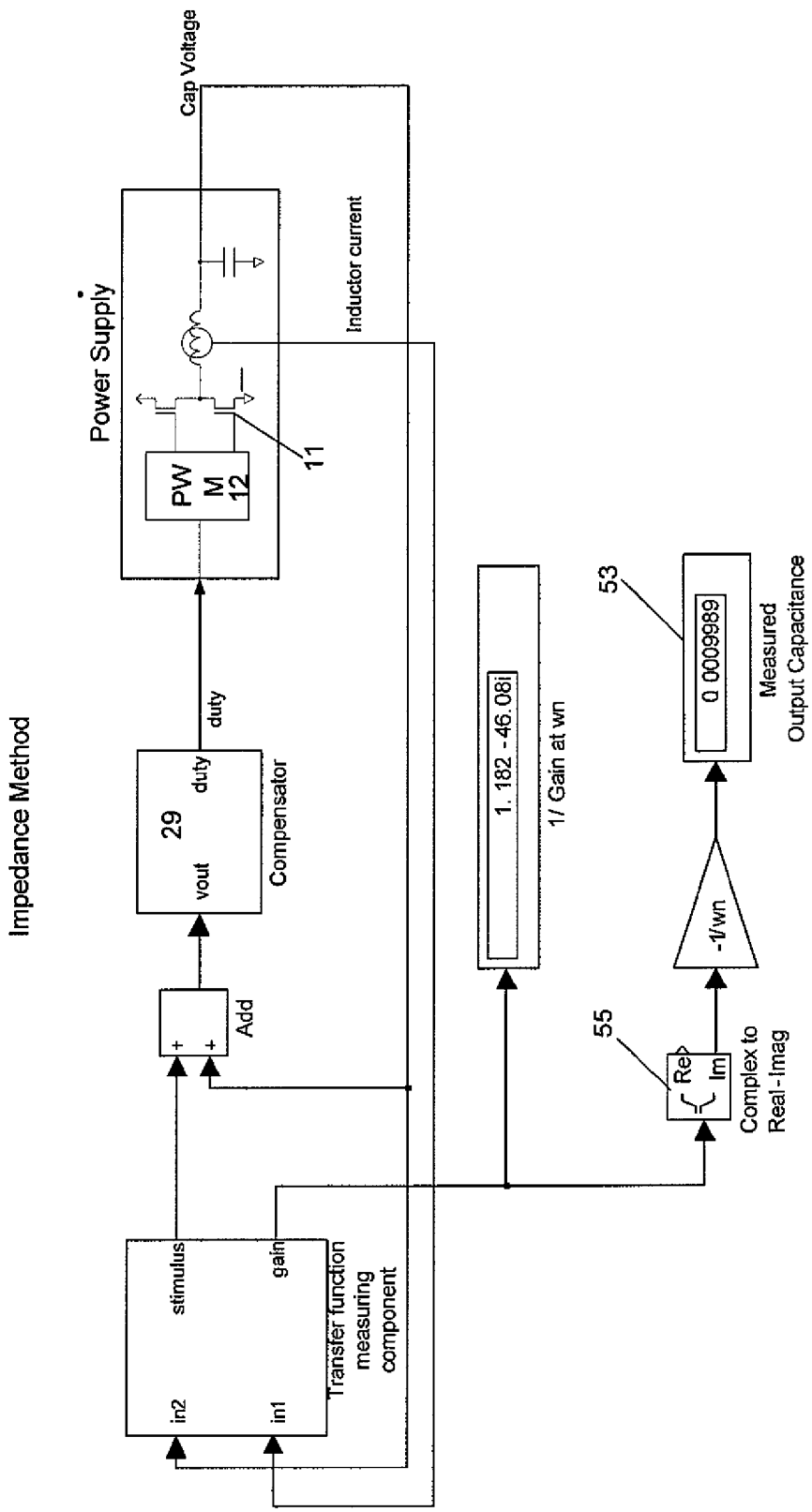
FIG. 6 is a schematic block diagram of an alternate method for capacitance extraction of these teachings.

Referring now to FIG. 6, another embodiment of the method for capacitance extraction is shown. In this embodiment, the capacitor admittance is measured and imaginary part 55 is used to calculate load capacitance 53. Capacitance 53 is given by:

$$C = \frac{\text{imag}(i(ind)/v(cap))}{wn} = \frac{\text{imag}((I_1 + iQ_1)/(I_2 + iQ_2))}{wn}$$

Another embodiment of the system of these teachings can include a synthesizable digital logic description of the block diagrams in FIGS. 4a and 4b, excluding the complex division calculation. The complex division calculations can be done in processor 13 (FIG. 4c).

It should be noted that, although the systems and methods have been described for the exemplary embodiment of the power supply, the systems and methods of these teachings can be applied to the control of other systems besides power supplies, for example, but not limited to, motor control. Although these teachings have been described with respect to various embodiments, it should be realized these teachings are also capable of a wide variety of further and other embodiments within the spirit and scope of these teachings.

What is claimed is:

1. A switching power supply comprising:
   a circuit including at least two reactive components, wherein the circuit provides an output voltage and is switched from one output voltage state to another output voltage state;
   at least one switching component operatively connected to switch the circuit between at least two switching states, wherein the at least two switching states include the one output voltage state and the another output voltage state;
   a driver component operatively connected to drive the at least one switching component to cause switching between two of the at least two switching states;
   a compensator component operatively connected to receive an input control signal and parameters, and to provide the at least two switching states to the driver component;
   a signal generator to provide sinusoidal basis signals having in-phase and quadrature components as input to the switching power supply;
   at least one correlator to receive the basis signals from the signal generator and at least one power supply signal from the switching power supply, and to provide at least one correlation between the at least one power supply signal and one of the in-phase and quadrature components; and
   a processor to:
      obtain a transfer function based on the at least one correlation;
      compute the parameters from the transfer function; and
      provide the parameters to the compensator component.

2. The switching power supply of claim 1 wherein the at least one power supply signal comprises an output power supply signal.

3. The switching power supply of claim 1 wherein the at least one power supply signal comprises an output power supply signal and an input power supply signal.

4. The switching power supply of claim 1 wherein the signal generator comprises an oscillator, that includes:
   a table of values providing the in-phase components and quadrature components; and
   a counter being updated when the table is accessed, wherein the oscillator accesses the values according to the updated counter.

5. The switching power supply of claim 1 wherein the signal generator comprises an oscillator that generates the in-phase components and quadrature components based on forward and backward Euler integrators.

6. The switching power supply of claim 1 wherein the at least one correlator comprises an accumulator that accumulates a product of two inputs.

7. The switching power supply of claim 1 wherein the processor:
  stores the transfer function in a computer readable medium; and
  recalls the transfer function from the computer readable medium based on pre-selected conditions.

8. A controller for a system, the controller comprising:
  a signal generator that provides sinusoidal basis signals having in-phase and quadrature components as input to the system;
  at least one correlator that receives the basis signals from the signal generator that receives at least one system signal from the system, and that provides at least one correlation between the at least one system signal and one of the in-phase and quadrature components; and
  a processor that
    obtains a transfer function based on the at least one correlation;
    computes parameters from the transfer function; and
    provides the parameters to the system.

9. The controller of claim 8 wherein the signal generator comprises an oscillator that includes:
  a table of values providing the in-phase components and quadrature components; and
  a counter being updated when the table is accessed,
  wherein the oscillator accesses the values according to the updated counter.

10. The controller of claim 8 wherein the signal generator comprises an oscillator that generates the in-phase components and quadrature components based on forward and backward Euler integrators.

11. The controller of claim 8 wherein the processor:
  store the transfer function in a computer readable medium; and
  recalls the transfer function from the computer readable medium based on pre-selected conditions.

12. The controller of claim 8 wherein the at least one correlator comprises an accumulator that accumulates a product of two inputs.

13. A method for obtaining parameters for adaptive control of a system, the method comprising:
  providing, in a switching power supply, at least one multiplier component, at least one adder component, and at least one delay component to obtain at least one correlation of at least one system signal received from the switching power supply with one of in-phase and quadrature components of sinusoidal basis signals input to the switching power supply;
  obtaining transfer function characteristics based on the at least one correlation; and
  obtaining parameters based on the transfer function characteristics.

14. The method of claim 13 wherein the at least one system signal comprises an output system signal.

15. The method of claim 13 wherein the at least one system signal comprises an output system signal and an input system signal.

16. The method of claim 13 further comprising:
  generating the basis signals by an oscillator.

17. The method of claim 16 wherein generating the basis signals comprises:
  associating the in-phase and quadrature components of the basis signals with a table of values;
  updating a counter when the table is accessed; and
  accessing the values according to the updated counter.

18. The method of claim 16 wherein generating the basis signals comprises:
  generating the in-phase and quadrature components based on forward and backward Euler integrators.

19. The method of claim 13 further comprising
  storing the transfer function characteristics in a computer readable medium; and
  recalling the transfer function characteristics from the computer readable medium based on pre-selected conditions.

* * * * *

UNITED STATES PATENT AND TRADEMARK OFFICE
CERTIFICATE OF CORRECTION

PATENT NO. : 8,344,716 B2  
APPLICATION NO. : 12/622484  
DATED : January 1, 2013  
INVENTOR(S) : Stewart Kenly et al.

It is certified that error appears in the above-identified patent and that said Letters Patent is hereby corrected as shown below:

Title Page 2, Column 1, Item (56)  
Other Publications, Line 5        Delete "G.M." and insert --G. M.,--  
Title Page 2, Column 1, Item (56)  
Other Publications, Line 9        Delete "G.M." and insert --G. M.,--  
Title Page 2, Column 2, Item (56)  
Other Publications, Line 1        Delete "G.M." and insert --G. M.,--  
Title Page 2, Column 2, Item (56)  
Other Publications, Line 4        Delete "al." and insert --al.,--  
Title Page 2, Column 2, Item (56)  
Other Publications, Line 7        Delete "al." and insert --al.,--

In the Claims:  
Column 8, Line 58, Claim 4        Delete "oscillator," and insert --oscillator--  
Column 9, Line 37, Claim 11       Delete "store" and insert --stores--  
Column 10, Line 34, Claim 19      Delete "comprising" and insert --comprising:--

Signed and Sealed this  
Twenty-second Day of October, 2013

Teresa Stanek Rea  
*Deputy Director of the United States Patent and Trademark Office*